(12) United States Patent
Isa

(10) Patent No.: US 6,911,387 B2
(45) Date of Patent: Jun. 28, 2005

(54) BUMP FORMING METHOD AND APPARATUS FOR HEATING AND COMPRESSING BUMP MATERIALS INSERTED IN POSITIONING HOLES

(75) Inventor: Yukihiro Isa, Tateyama (JP)

(73) Assignee: UMC Japan, Tateyama (JP)

(*) Notice: Subject to any disclaimer, the term of this patent is extended or adjusted under 35 U.S.C. 154(b) by 121 days.

(21) Appl. No.: 10/648,681

(22) Filed: Aug. 25, 2003

(65) Prior Publication Data

US 2004/0082160 A1 Apr. 29, 2004

(30) Foreign Application Priority Data

Sep. 10, 2002 (JP) .................................. 2002-264052

(51) Int. Cl.[7] .......................... H01L 21/44; B23P 19/00
(52) U.S. Cl. ................................... 438/612; 29/729
(58) Field of Search ........................... 438/120, 597, 438/612, 613, 660; 29/729, 745

(56) References Cited

U.S. PATENT DOCUMENTS

| | | | | |
|---|---|---|---|---|
| 6,025,258 A | * | 2/2000 | Ochiai et al. ............... | 438/613 |
| 6,253,992 B1 | * | 7/2001 | Fjelstad ...................... | 228/245 |
| 6,268,275 B1 | * | 7/2001 | Cobbley et al. ............ | 438/612 |
| 6,270,002 B1 | * | 8/2001 | Hayashi et al. ............. | 228/246 |
| 6,271,110 B1 | * | 8/2001 | Yamaguchi et al. ........ | 438/613 |
| 6,528,346 B2 | * | 3/2003 | Ochiai et al. ............... | 438/108 |
| 6,541,364 B2 | * | 4/2003 | Mukuno et al. ............ | 438/612 |

FOREIGN PATENT DOCUMENTS

JP 11-031697 2/1999

* cited by examiner

Primary Examiner—Michael S. Lebentritt
Assistant Examiner—Scott B. Geyer
(74) Attorney, Agent, or Firm—Cohen, Pontani, Lieberman & Pavane

(57) ABSTRACT

A bump forming method and apparatus by which no deformed bump having an abnormal shape is formed and no shape correcting process is necessary, the member for handling the bump materials can be easily changed, and the position of the member after the change of the member can be easily adjusted with a desired accuracy, thereby shortening the bump forming process and reducing the manufacturing cost. A positioning member is set above a heating device. Bump materials are inserted into positioning holes of the positioning member and are made to partially protrude from the holes toward a side opposite to the heating device. A semiconductor substrate is positioned onto the positioning member so that the semiconductor substrate faces the protruding side of the bump materials. The bump materials are heated and pressed from the protruding side via the semiconductor substrate so as to form bumps having a specific shape.

8 Claims, 3 Drawing Sheets

BUMP FORMING METHOD AND APPARATUS FOR HEATING AND COMPRESSING BUMP MATERIALS INSERTED IN POSITIONING HOLES

BACKGROUND OF THE INVENTION

1. Field of the Invention

The present invention relates to a bump forming method and apparatus, and in particular, relates to a method and apparatus by which when bumps are formed at specific positions on a main surface of a semiconductor substrate, no deformed bump is formed and no shape correcting process is necessary, thereby shortening the bump forming process and reducing the manufacturing cost.

2. Description of the Related Art

In conventional semiconductor devices such as ICs, LSIs, and VLSIs, bumps are formed at specific positions (typically, on bonding pads) on a silicon wafer (i.e., a semiconductor substrate) by compression-bonding of bump balls made of metal material, printing of metal paste, plating of metal layers, wire-bonding connection, or the like. One of these methods is selected according to the shape or size of the bumps to be formed. Here, the shape or size of the bumps necessary depends on the shape or thickness of the final device package.

Regarding the compression-bonding of bump balls, various methods have been developed. For example, a bonding head is used on which attraction holes for attracting bump balls are provided at specific positions so as to arrange attracted bump balls, and these arranged bump balls are compressed onto bonding pads provided on a silicon wafer (see Japanese Unexamined Patent Application, First Publication No. Hei 11-31697 (refer to pp. 4–5, and FIG. 1), or the etc.).

Generally, when a relatively large number of bump balls are compression-bonded, the number of bonding pads on a silicon wafer may be several hundred thousand. In this case, the area of the silicon wafer is divided into sections in a manner such that the number of bump balls for each section is equal to or smaller than a specific number, and a set of bump balls for each section are compression-bonded all together onto the section.

In conventional compression-bonding of bump balls, the bonding head must be processed with a specific processing accuracy so as to form a large number of attraction holes at specific positions on an attraction face, where the number of the attraction holes is determined depending on the size and number of the bump balls to be attracted. Such processing is not easy.

When the bump balls are compression-bonded all together onto a large number of bonding pads, the force for attracting the bump balls may be reduced, and as a result, it is difficult to compression-bond bump balls all together.

In addition, when bump balls are attracted to the attraction holes, the bump balls may be deformed. In this case, the deformed shapes must be corrected in a subsequent process. Such correction of the shapes of the bump balls is also performed by compression-bonding; thus, two compression-bonding processes must be performed.

If the type of the semiconductor device to be manufactured is changed, the bonding head must be changed according to the type. Here, the bonding head is moved with respect to the silicon wafer; thus, the movement of the bonding head must also be highly accurate and precise.

Therefore, when the bonding head is changed, the position or the like of the bonding head must be adjusted again; thus, it is not easy to change the bonding head.

SUMMARY OF THE INVENTION

In consideration of the above circumstances, an object of the present invention is to provide a bump forming method and apparatus by which when bumps are formed at specific positions on a main surface of a semiconductor substrate, no deformed bump having an abnormal shape is formed and no shape correcting process is necessary, the member for handling the bump materials can be easily changed, and the position of the member after the change of the member can be easily adjusted with a desired accuracy, thereby shortening the bump forming process and reducing the manufacturing cost.

The present invention provides a bump forming method of forming bumps at specific positions on a main surface of a semiconductor substrate, comprising the steps of:

setting a positioning member above a heating device, where the positioning member has a plate body in which positioning holes for positioning bump materials are provided at predetermined positions which correspond to the specific positions on the main surface of the semiconductor substrate, and at least a portion of a top face of the heating device is provided as a heating surface for heating the bump materials;

inserting the bump materials into the positioning holes and making the bump materials partially protrude from the holes toward a side opposite to the heating device;

positioning the semiconductor substrate onto the positioning member so that the semiconductor substrate faces the protruding side of the bump materials;

heating the bump materials by using the heating device and simultaneously pressing the bump materials from the protruding side of the materials via the semiconductor substrate by a pressing device; and bonding the bump materials at the specific positions on the main surface of the semiconductor substrate.

According to the above method, holding and positioning of the bump materials can be easily performed. In addition, bumps having a specific shape can be formed by a single compressing and heating operation; thus, no bump material has an abnormal shape which requires an operation for correcting the shape. Accordingly, it is possible to reduce the time for performing the bump forming process and also reduce the manufacturing cost.

The method may further comprise the step of generating ultrasonic waves toward the bump materials by using an ultrasonic oscillating device when the bump materials are heated and pressed, so as to improve contact strength between the bump materials and the semiconductor substrate.

The present invention also provides a bump forming apparatus for forming bumps at specific positions on a main surface of a semiconductor substrate, the apparatus comprising:

a heating device in which at least a portion of a top face is provided as a heating surface for heating bump materials;

a positioning member set above the heating device, the positioning member having a plate body in which positioning holes for positioning the bump materials are provided at predetermined positions which correspond to the specific positions on the main surface of the semiconductor substrate; and a pressing device for pressing the bump materials inserted in the positioning holes via the semiconductor substrate positioned onto the positioning member while the bump materials are heated by the heating device, where the bump materials to be pressed are partially protruded from the positioning holes toward a side opposite to the heating device and the semiconductor substrate faces the protruding side of the bump materials.

According to the apparatus, holding and positioning of the bump materials can be easily performed. Therefore, it is possible to reduce the time for performing the bump forming process and also reduce the manufacturing cost.

In a typical example, the heating device has a plate body and a main surface of the plate body functions as the heating surface, and a heating source is built inside the heating device.

Typically, the bump materials are bump balls and the positioning member has a thickness less than the maximum diameter of the bump balls.

The positioning member may have a first magnetic material and the heating device may have a second magnetic material, so that a predetermined space is secured between the positioning member and the heating device which face each other, according to repulsive force produced by the first and second magnetic materials.

The bump forming apparatus may further comprise an electrostatic charge dissipating device for dissipating electrostatic charge of the bump balls.

The bump forming apparatus may further comprise an ultrasonic oscillating device for generating ultrasonic waves toward the bump materials.

DESCRIPTION OF THE PREFERRED EMBODIMENTS

Hereinafter, embodiments of the bump forming method and apparatus according to the present invention will be explained with reference to the drawings.

Figure 1:
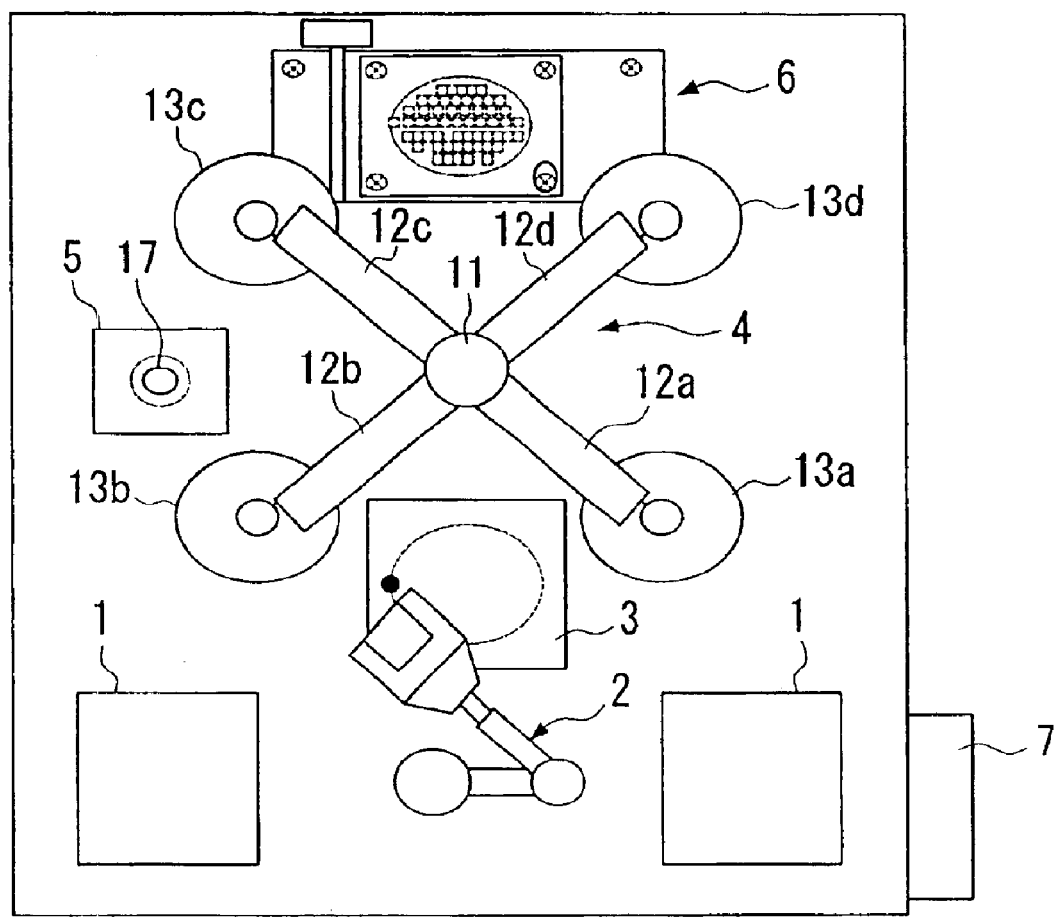
FIG. 1 is a plan view for showing a bump ball arranging and compression-bonding system for implementing the bump forming method as an embodiment of the present invention.

FIG. 1 is a plan view for showing a bump ball arranging and compression-bonding system for implementing the bump (ball) forming method as an embodiment of the present invention. In the figure, reference numeral 1 indicates a cassette platform, reference numeral 2 indicates a transfer robot, reference numeral 3 indicates a positioning table, reference numeral 4 indicates a cross arm, reference numeral 5 indicates an alignment unit, reference numeral 6 indicates a bonding head (i.e., a bump forming apparatus), and reference numeral 7 indicates a control panel for controlling the above elements.

The cassette platform 1 is a dedicated platform for setting a wafer cassette in which a plurality of silicon wafers (i.e., semiconductor substrates, where the silicon wafer may be simply called the wafer, hereinbelow) are contained.

The transfer robot 2 has a mechanism for extracting each wafer from the wafer cassette set on the cassette platform 1 in turn, inverting the position of the wafer by 180° in the vertical direction, and then setting this inverted wafer at a specific position on the positioning table 3.

The positioning table 3 is provided for defining the direction of an orientation flat or a notch of the wafer and for determining the position of the wafer to be held.

The cross arm 4 has a rotation shaft 11 which is vertically positioned, four arms 12a to 12d horizontally and radially extending from the rotation shaft 11, and wafer holding pads 13a to 13d, respectively attached to the heads of the arms 12a to 12d, each pad having an adjustment mechanism for attracting and holding a wafer and moving the wafer in the θ direction (i.e., the direction of the angle of rotation) and in the Z direction (i.e., the vertical direction). The wafers, respectively held by the wafer holding pads 13a to 13d, are transferred by clockwise rotating the arms 12a to 12d around the rotation shaft 11.

The wafer holding pads 13a to 13d also function as a pressing device for compressing bump balls 22 (explained below) via a wafer.

The alignment unit 5 is provided for performing alignment (relating to parallelability and position) of the wafer 17 transferred from the positioning table 3 by using the cross arm 4.

Figure 2:
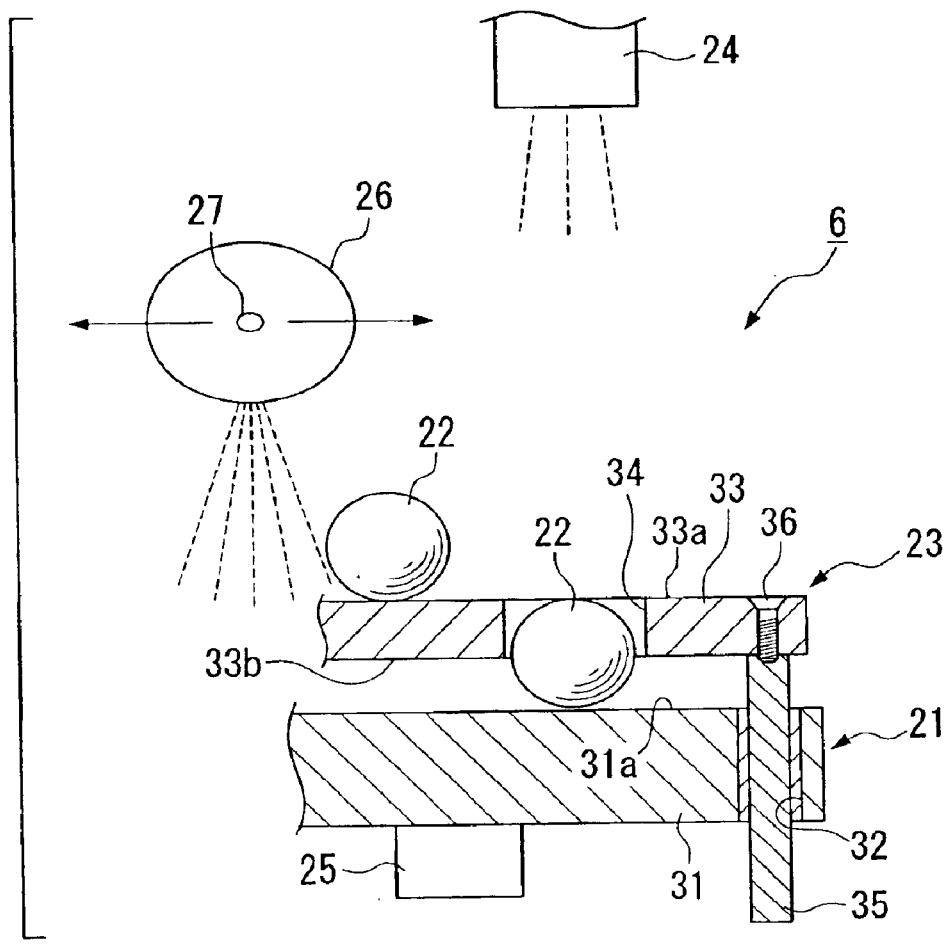
FIG. 2 is a sectional view showing the structure of the bonding head used in the bump ball arranging and compression-bonding system in the embodiment.
Figure 3:
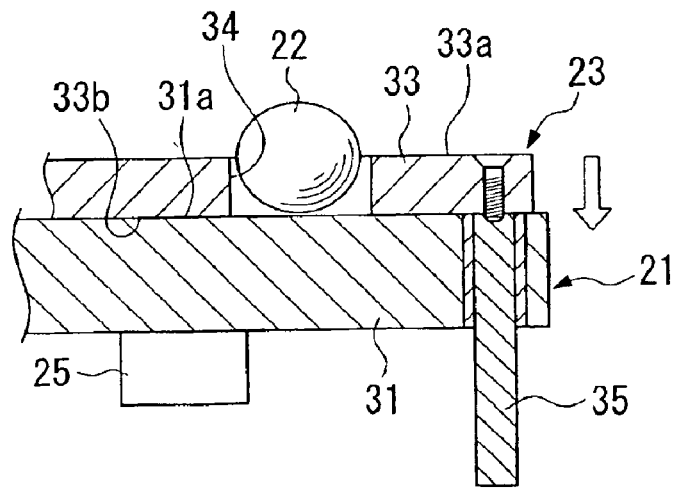
FIG. 3 is a diagram for explaining the bump forming process in the embodiment.

As shown in FIG. 2, the bonding head 6 is a bump forming apparatus for forming bumps on pads provided at predetermined positions on a surface (i.e., a main surface) of a wafer. The bonding head 6 has a double-plate structure consisting of a heater plate 21 (i.e., a heating device) and a bump ball arrangement plate 23 (i.e., a positioning member) for arranging bump balls 22 (i.e., bump materials). The bonding head 6 also includes an ionizer 24 (i.e., an electrostatic charge dissipating device), an ultrasonic generator 25 (i.e., an ultrasonic oscillating device), and an air blower 26 (i.e., a bump ball arranging device).

The main body of the heater plate 21 is a flat plate 31 (i.e., a plate body) made of, for example, (i) metal such as titanium (Ti) or stainless steel, which has high heat resistance, or alloy of such metal, (ii) semiconductor material such as silicon (Si), or (iii) ceramics such as silicon carbide (SiC) or aluminum nitride (AlN). The top face 31a (i.e., a main surface) of the plate 31 is polished so as to function as a heating surface for heating the bump balls 22. In addition, a temperature sensor for measuring the temperature of the top face 31a and a heater (i.e., a heating source) are provided in the heater plate 21, where this heater is controlled by using the control panel 7. At each of the four corners of this plate 31, a through hole 32 for inserting a movable shaft 35 (explained below) is formed in the vertical direction, where the diameter of the through hole 32 is slightly larger than that of the movable shaft 35.

The bump ball arrangement plate 23 is arranged above the heater plate 21 and in parallel to the heater plate 21. The main body of the bump ball arrangement plate 23 is a flat plate 33 (i.e., a plate body) which has substantially the same shape of the above-explained plate 31 and which is also made of, for example, (i) metal such as titanium (Ti) or stainless steel, which has high heat resistance, or alloy of such metal, (ii) semiconductor material such as silicon (Si), or (iii) ceramics such as silicon carbide (SiC) or aluminum nitride (AlN). The top face 33a (as a main surface) of the plate 33 is polished, and holes 34 for positioning the bump balls 22 are formed at predetermined positions on the top face 33a (in FIG. 2, only one hole 34 is shown).

The thickness of the plate 33 is less than the maximum diameter of the bump balls 22, and the diameter of each hole 34 is slightly larger than the maximum diameter of the bump balls 22.

For example, when the maximum diameter of the bump balls 22 is 50 μm, the thickness of the plate 33 is 25 to 30 μm, and the diameter of the hole 34 is 55 μm.

At each of the four corners of the plate 33, the head of the movable shaft 35 is fastened by using a fastening member such as a bolt 36. The space between the bottom face 33b of the plate 33 and the top face 31a of the plate 31 can be adjusted by moving the movable shaft 35 in the vertical direction. More specifically, a specific space such as 15 to 25 μm can be secured.

The plate 33 also has a pull mechanism (not shown) for pulling the plate 33 from every corner and holding the plate so as to prevent the plate 33 from warping when the bump balls 22 are disposed on the plate 33. In another method for preventing a warp of the plate 33, the bump balls may be supplied little by little, that is, continuously or intermittently.

The ionizer 24 is a device for dissipating electrostatic charge produced around the bump balls 22, so as to prevent a small number of supplied bump balls from being attracted to each other due to electrostatic charge produced by the contact between the supplied bump balls.

The ultrasonic generator 25 is used for generating ultrasonic waves at a contact surface between each bump ball 22 and the corresponding pad 37 on the wafer when the bump ball 22 is compression-bonded on the pad 37. According to the generated ultrasonic waves, a resonant state is produced in the vicinity of the contact surface, thereby improving the contact strength between the bump ball 22 and the pad 37.

The air blower 26 is used for inserting bump balls 22, supplied onto the top face 33a of the plate 33, into all the positioning holes 34 and collecting extra bump balls 22 which have not inserted into the holes 34. These operations are performed by moving the shaft 27 of the air blower 26 in a direction above the top face 33a of the plate 33 (see the arrows in FIG. 2). Here, a dedicated brush or the like may be used instead of the air blower 26, so as to insert the bump balls 22 into all the positioning holes 34.

Below, the bump ball forming method as an embodiment of the present invention will be explained with reference to FIGS. 1 to 5.

First, a wafer cassette, in which wafers are contained, is set on the cassette platform 1.

In the next step, a wafer is extracted from the cassette stage by using the transfer robot 2, which inverts the wafer by 180° in the vertical direction and transfers the inverted wafer onto the positioning table 3, so as to set the wafer at a predetermined position on the positioning table 3.

On the positioning table 3, the direction of an orientation flat or a notch of the wafer is defined, and the position of the wafer to be held is determined.

Each wafer, whose direction of an orientation flat or a notch has been defined, is held by the wafer holding pads 13a to 13d of the cross arm 4 in turn. The cross arm 4 can efficiently transfer the wafers by clockwise rotating the arms 12a to 12d around the rotation shaft 11.

For example, the wafer held by the wafer holding pad 13a is transferred and set to the alignment unit 5 by clockwise rotating the arm 12a around the rotation shaft 11.

The alignment unit 5 performs alignment (relating to parallelability and position) of the wafer. During the alignment, bump balls 22 are arranged at the bonding head 6, so that the bump balls 22 are in a stand-by state.

The method of arranging the bump balls 22 will be explained below.

First, as shown in FIG. 2, the bump ball arrangement plate 23 is moved upward by moving upward the movable shafts 35 attached at the four corners of the plate 33, so that the space between the bottom face 33b of the plate 33 and the top face 31a of the plate 31 is set to a predetermined value, for example, 15 to 25 μm.

In the next step, the bump balls 22 are supplied onto the bump ball arrangement plate 23. Here, in order to prevent the bump balls 22 from being attracted to each other by electrostatic charge, the electrostatic charge produced around the bump balls 22 is dissipated in advance by using the ionizer 24.

Next, the shaft 27 of the air blower 26 (or a dedicated brush or the like) is moved along a direction (see the arrows in FIG. 2) above the top face 33a of the plate 33, so that the bump balls 22, from which electrostatic charge has been dissipated, are inserted into all the positioning holes 34, and simultaneously, extra bump balls 22 on the plate 33 are collected at the edge of the plate 33.

In the next step, the movable shafts 35 are moved downward so as to move the bump ball arrangement plate 23 downward, thereby making the bottom face 33b of the plate 33 contact the top face 31a of the plate 31. Accordingly, an upper end portion (as a face to be compressed and bonded) of each bump ball 22, inserted in the positioning hole 34, protrudes from the upper end of the hole 34 (see FIG. 3).

Figure 4:
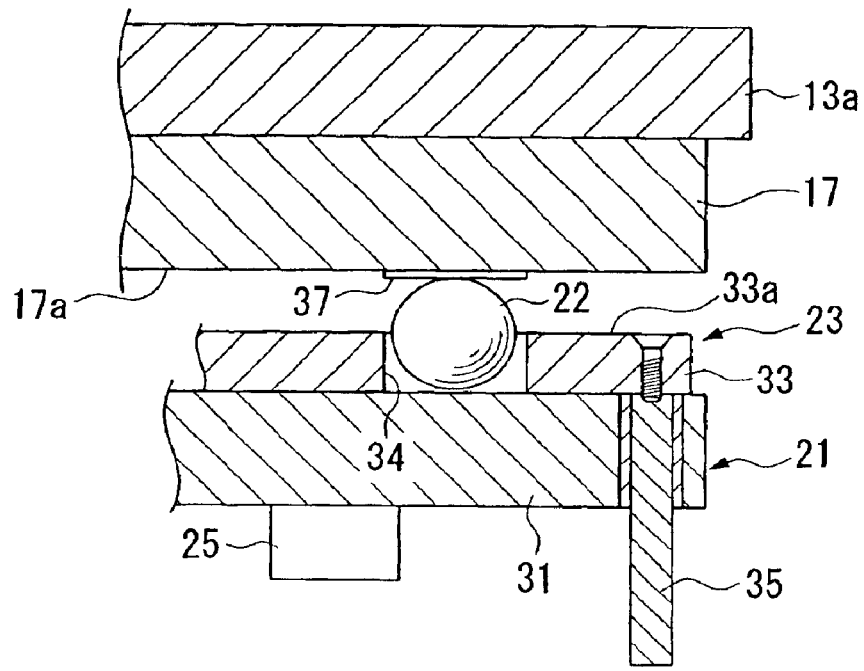
FIG. 4 is also a diagram for explaining the bump forming process in the embodiment.

In the following step, as shown in FIG. 4, the cross arm 4 is operated so as to attract a wafer, for which the alignment (relating to parallelability and position) has been completed, by the wafer holding pad 13a. The attracted wafer 17 is moved to the origin (i.e., defined as the home position) above the top face 33a of the plate 33 and is then lowered so as to make each bonding pad 37, which is attached to the bottom face 17a of the wafer 17, contact the upper end of the corresponding bump ball 22.

Figure 5:
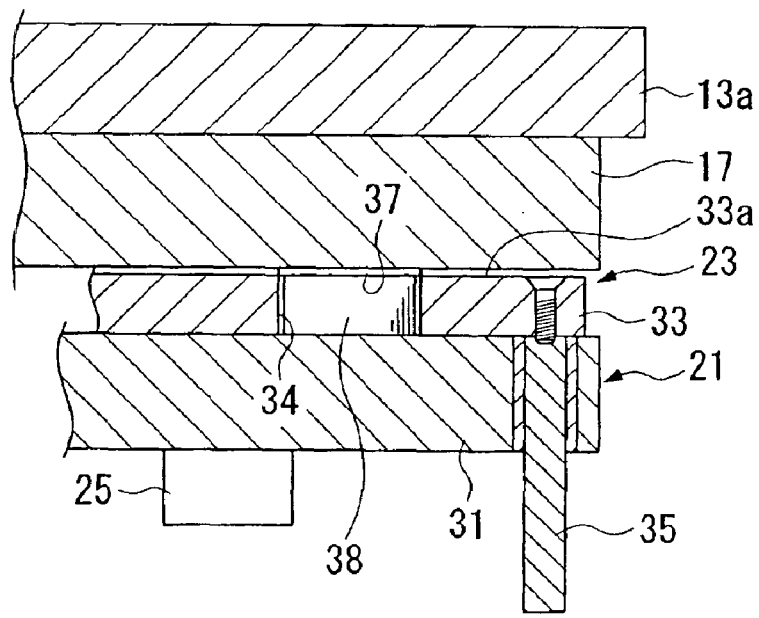
FIG. 5 is also a diagram for explaining the bump forming process in the embodiment.

In the next step, as shown in FIG. 5, the plate 31 is heated to, for example, 150 to 250° C. by using the built-in heater while the wafer 17 is pressed with a predetermined pressure by the wafer holding pad 13a. Accordingly, each bump ball 22 is softened and simultaneously pressed and deformed so that the bump ball 22 is transformed into a bump 38 which has a specific shape matching the shape of the corresponding hole 34.

Accordingly, bumps 38 are compression-bonded onto the bonding pads 37 provided on the bottom face 17a of the wafer 17 by a single compressing and heating operation.

When ultrasonic waves are generated at a contact face between each bump ball 22 and the bonding pad 37 by using the ultrasonic generator 25 in the compressing and heating operation, a resonant state can be produced in the vicinity of the contact face, thereby improving the contact strength between the bump ball 22 and the bonding pad 37.

The wafer 17, on which the bumps 38 are bonded, is returned to the origin position by raising the wafer holding pad 13a and is then transferred to the positioning table 3 by rotating the cross arm 4. The wafer holding pad 13a is then lowered so that the wafer 17 is put on the positioning table 3.

The wafer 17 is held by the transfer robot 2 again. This wafer 17 is inverted by 180° in the vertical direction and is then stored into the wafer cassette set on the cassette platform 1.

As explained in detail above, according to the bump ball forming method of the present embodiment, the bump balls 22, from which electrostatic charge has been dissipated, are inserted into the positioning holes 34 on the bump ball arrangement plate 23. Therefore, in comparison with the conventional case of attracting bump balls, holding and positioning of the bump balls can be more easily performed.

In addition, the plate 31 is heated to a predetermined temperature by using a built-in heater while the wafer 17 is pressed with a predetermined pressure by using the wafer holding pad 13a, so that each bump ball 22 is softened and simultaneously pressed and deformed and that the bump ball 22 is transformed into a bump 38 having a specific shape. Therefore, the bumps 38, each having a specific shape, can be formed by a single compressing and heating operation; thus, no bump ball 22 has an abnormal shape which requires an operation for correcting the shape. Accordingly, it is possible to reduce the time for performing the bump forming process and also reduce the manufacturing cost.

According to the bump ball arranging and compression-bonding system in the present embodiment, the bonding head 6 has a double-plate structure consisting of the heater plate 21 and the bump ball arrangement plate 23 for arranging the bump balls 22. Therefore, the holding and positioning operation of the bump balls can be easily performed, thereby reducing the time necessary for the bump forming process and also reducing the manufacturing cost.

In addition, the ionizer 24 is provided. Therefore, when the bump balls 22 are supplied onto the bump ball arrangement plate 23, electrostatic charge produced by the contact between the bump balls 22 can be dissipated. Accordingly, it is possible to prevent the bump balls from being attracted to each other.

Additionally, the ultrasonic generator 25 is provided. Therefore, ultrasonic waves can be generated at a contact face between each bump ball 22 and the bonding pad 37, thereby producing a resonant state in the vicinity of the contact face and improving the contact strength between the bump ball 22 and the bonding pad 37.

Furthermore, in another method of securing a predetermined space between the bump ball arrangement plate 23 and the heater plate 21, the bump ball arrangement plate 23 has a first magnetic material and the heater plate 21 has a second magnetic material, so that a predetermined space is secured between the bump ball arrangement plate 23 and the heater plate 21 which face each other, according to repulsive force produced by the first and second magnetic materials.

What is claimed is:

1. A bump forming method of forming bumps at specific positions on a main surface of a semiconductor substrate, comprising the steps of:

setting a positioning member above a heating device, where the positioning member has a plate body in which positioning holes for positioning bump materials are provided at predetermined positions which correspond to the specific positions on the main surface of the semiconductor substrate, and at least a portion of a top face of the heating device is provided as a heating surface for heating the bump materials;

inserting the bump materials into the positioning holes and making the bump materials partially protrude from the holes toward a side opposite to the heating device;

positioning the semiconductor substrate onto the positioning member so that the semiconductor substrate faces the protruding side of the bump materials;

heating the bump materials by using the heating device and simultaneously pressing the bump materials from the protruding side of the materials via the semiconductor substrate by a pressing device; and bonding the bump materials at the specific positions on the main surface of the semiconductor substrate.

2. A bump forming method as claimed in claim 1, further comprising the step of:

generating ultrasonic waves toward the bump materials by using an ultrasonic oscillating device when the bump materials are heated and pressed, so as to improve contact strength between the bump materials and the semiconductor substrate.

3. A bump forming apparatus for forming bumps at specific positions on a main surface of a semiconductor substrate, the apparatus comprising:

a heating device in which at least a portion of a top face is provided as a heating surface for heating bump materials;

a positioning member set above the heating device, the positioning member having a plate body in which positioning holes for positioning the bump materials are provided at predetermined positions which correspond to the specific positions on the main surface of the semiconductor substrate; and a pressing device for pressing the bump materials inserted in the positioning holes via the semiconductor substrate positioned onto the positioning member while the bump materials are heated by the heating device, where the bump materials to be pressed are partially protruded from the positioning holes toward a side opposite to the heating device and the semiconductor substrate faces the protruding side of the bump materials.

4. A bump forming apparatus as claimed in claim 3, wherein the heating device has a plate body and a main surface of the plate body functions as the heating surface, and a heating source is built inside the heating device.

5. A bump forming apparatus as claimed in claim 3, wherein the bump materials are bump balls and the positioning member has a thickness less than the maximum diameter of the bump balls.

6. A bump forming apparatus as claimed in claim 3, wherein the positioning member has a first magnetic material and the heating device has a second magnetic material, so that a predetermined space is secured between the positioning member and the heating device which face each other, according to repulsive forces produced by the first and second magnetic materials.

7. A bump forming apparatus as claimed in claim 3, further comprising an electrostatic charge dissipating device for dissipating electrostatic charge of the bump balls.

8. A bump forming apparatus as claimed in claim 3, further comprising an ultrasonic oscillating device for generating ultrasonic waves toward the bump materials.

* * * * *